United States Patent [19]
Chin

[11] Patent Number: 4,461,965
[45] Date of Patent: Jul. 24, 1984

[54] HIGH SPEED CMOS SENSE AMPLIFIER

[75] Inventor: Sing W. Chin, Walnut Creek, Calif.

[73] Assignee: National Semiconductor Corporation, Santa Clara, Calif.

[21] Appl. No.: 179,181

[22] Filed: Aug. 18, 1980

[51] Int. Cl.³ .................... H03K 5/24; H03K 3/356
[52] U.S. Cl. .................................... 307/530; 307/355; 307/279
[58] Field of Search .............. 307/240, 243, 355, 362, 307/530, 279, DIG. 3; 365/205

[56] References Cited

U.S. PATENT DOCUMENTS

| | | | |
|---|---|---|---|
| 3,321,639 | 5/1967 | Fowler et al. | 307/355 X |
| 3,983,544 | 9/1976 | Dennison et al. | 307/DIG. 3 X |
| 3,983,545 | 9/1976 | Cordaro | 307/530 X |
| 4,003,035 | 1/1977 | Hoffman et al. | 307/530 X |
| 4,028,558 | 6/1977 | Heller et al. | 307/355 |
| 4,045,686 | 8/1977 | Masuda | 307/355 |
| 4,075,509 | 2/1978 | Redfern | 307/355 X |
| 4,169,233 | 9/1979 | Haraszti | 307/355 |
| 4,191,900 | 3/1980 | Redfern et al. | 307/355 |
| 4,198,622 | 4/1980 | Connolly, Jr. et al. | 340/347 AD X |
| 4,238,841 | 12/1980 | Clemen et al. | 367/530 X |
| 4,316,105 | 2/1982 | Fowler | 307/355 X |
| 4,317,054 | 2/1982 | Caruso et al. | 307/355 X |

Primary Examiner—Larry N. Anagnos
Attorney, Agent, or Firm—Gail W. Woodward; Paul J. Winters; Michael J. Pollock

[57] ABSTRACT

A pair of CMOS inverters are cross coupled in a latching configuration. Both inverter supply terminals are coupled to complementary toggles that can render the inverters operative or inoperative. First, the inverters are rendered inoperative. An output switch is coupled between the output nodes so that the inverter's output nodes can be driven to the same potential, thus canceling any offset voltage. An input switch produces sampling over a time interval that extends beyond the output switch on period. After the sampling period, the toggles are operated to turn the inverters on and to produce a latch state determined by the potential change present in the sampling interval.

6 Claims, 4 Drawing Figures

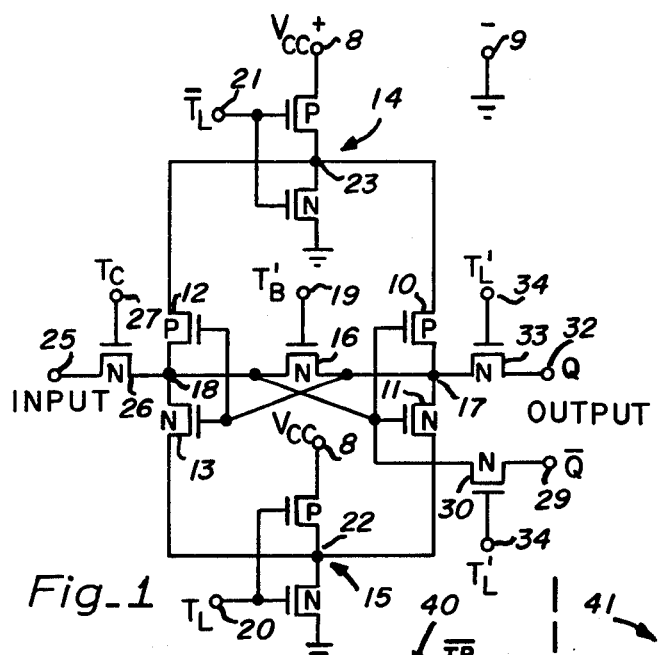
Fig_1
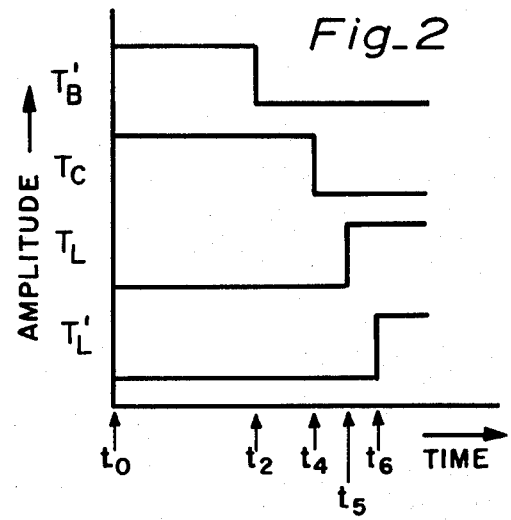
Fig_2
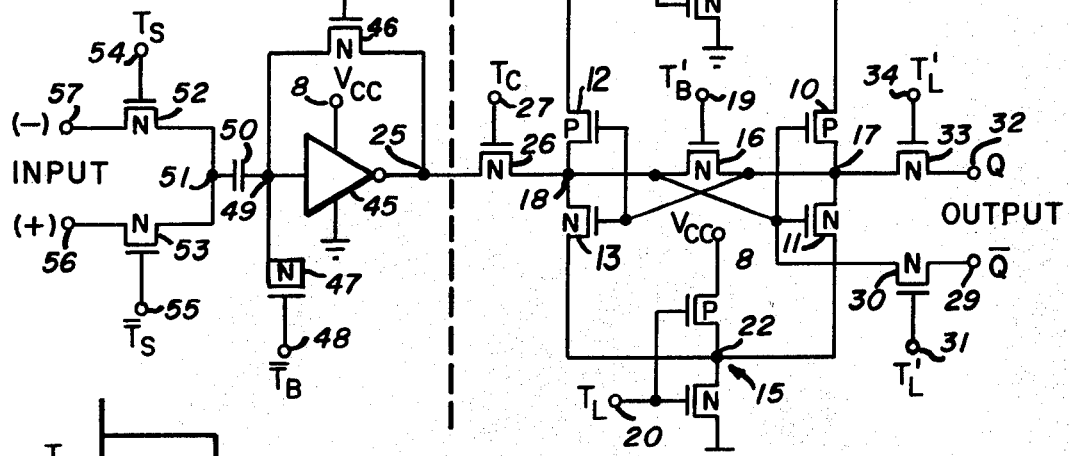
Fig_3
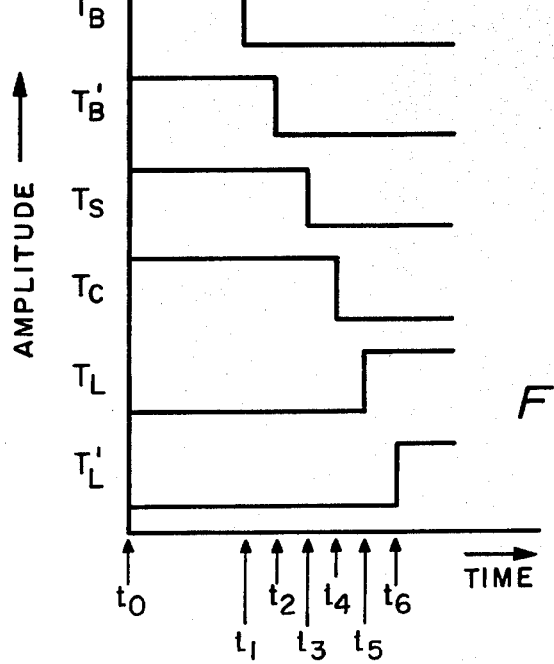
Fig_4

HIGH SPEED CMOS SENSE AMPLIFIER

BACKGROUND OF THE INVENTION

The invention is related to complementary metal oxide semiconductor (CMOS) devices and has application to the inventions disclosed in U.S. Pat. No. 4,191,900 which issued Mar. 4, 1980, and U.S. Pat. No. 4,198,622 which issued Apr. 15, 1980, both of which are assigned to the Assignee of the present invention. These patents disclose plural input clocked comparators useful in Analog/Digital (A/D) converters. The invention has further application to memory device comparators or any system in which a sense amplifier can be used to detect a differential voltage of a single input over a predetermined time interval.

SUMMARY OF THE INVENTION

It is an object of the invention to provide a clocked sense amplifier having high speed.

It is a further object of the invention to provide a clocked sense amplifier having automatic offset cancellation.

It is a still further object of the invention to provide a clocked sense amplifier capable of rapidly responding to an input with any voltage between $V_{CC}$ and ground, and assuming a state determined by input polarity during a predetermined time interval.

These and other objects are achieved in a circuit configured as follows. A pair of CMOS inverters are cross coupled in a latching configuration. The supply terminals of the inverters are coupled to polarity reversing toggles that are operated complementarily. In one state the toggles cause the inverters to operate normally as a latch. In the other state the inverters are disabled by using a supply polarity that turns the transistors off. A latch switch is coupled between the inverter output nodes. An input switch is coupled to one output node and a pair of output switches are coupled between the output nodes and the circuit output terminals.

First, the toggles are operated to disable the latch, the input and latch switches turned on, and the output switches turned off. Under this set of conditions both latch output nodes charge to the input voltage. Then the latch switch is turned off, thereby allowing one latch output to float at whatever potential it was at turnoff. At this point, the other latch output is allowed to assume whatever voltage is to be sensed during what is called the sense interval. Then the input switch is turned off, thereby allowing both nodes of the latch to float. Then the toggles are reversed so as to allow the latch to operate. It will very quickly regenerate to a state indicated by the potential difference in output nodes. Then the output switches are turned on so that the latch states are available at the output terminals.

If desired, the circuit can be operated from a clocked comparator amplifier, in which case, the output is indicated as a function of a pair of d-c voltages existing during the sense interval. Because the various circuit elements are operated in a sequence, switching transients do not affect the output. Since the latch nodes are substantially disconnected during the sense interval and subsequently operate the latch, the sense operation is very fast.

BRIEF DESCRIPTION OF THE DRAWING

FIG. 1 is a schematic diagram of the sense amplifier circuit.

FIG. 2 is a graph showing the operation of the various clock points in FIG. 1.

FIG. 3 is a schematic diagram of the sense amplifier in combination with a clocked comparator.

FIG. 4 is a graph showing the operation of the various clock points in FIG. 3.

DESCRIPTION OF THE INVENTION

In the following description, conventional CMOS circuits are employed. While N channel switching devices are shown for most of the swtiches, it is to be understood that CMOS transmission gates could be employed if desired. The various waveforms to be shown are merely to indicate timing. The amplitudes will be selected to provide the required switch actions. A positive voltage or high state will be assumed to turn the related N channel devices on and P channel devices off. A negative or low state will be assumed to turn N channel devices off and P channel devices on.

The various logic states to be shown can be derived from conventional logic circuitry, using the clock sources disclosed in U.S. Pat. Nos. 4,191,900 and 4,198,622.

The circuit of the invention is shown in FIG. 1. The circuit is operated from a power supply connected between $V_{CC}$ terminal 8 and ground terminal 9. The transistors shown are cnventional CMOS devices with the N channel devices having grounded substrates. The P channel devices have their substrates connected to $V_{CC}$.

Complementary transistors 10 and 11 form an inverter gate having an output node 17. Complementary transistors 12 and 13 also form an inverter gate that has output node 18. The inputs to the inverters are cross connected to create a latching configuration.

Switch 16, which is operated from a signal at control terminal 19, couples across nodes 17 and 18 so that when it is turned on, these nodes are forced to the same potential.

Toggles 14 and 15 are coupled to the two supply ends of the inverter gates, nodes 22 and 23, and are operated by complementary signals $\overline{T_L}$ and $T_L$ which are applied to control terminals 21 and 20, respectively. When $T_L$ is high, the N channel device of toggle 15 will be on and node 22 grounded. For this condition, $\overline{T_L}$ will be low and the P channel device of toggle 14 will be on, thus connecting node 23 to $V_{CC}$. This will cause both inverter gates to function normally as a latch. However, if $T_L$ at terminal 20 is low, the P channel device in toggle 15 will be on, thus connecting nodes 22 to $V_{CC}$. At the same time the N channel device in toggle 14 will be on, thereby grounding node 23. For this condition devices 10 through 13 will all be turned off, thus allowing nodes 17 and 18 to float. It can be seen that the toggles 14 and 15 switch the circuit from a latch to an open circuit depending upon the state of $T_L$.

Switch 16, when on as determined by $T_B'$ at terminal 19, can couple nodes 17 and 18 together so as to force them to the same potential.

Node 18 is coupled to input terminal 25 by N channel device 26, which is operated by $T_C$ applied to terminal 27. Node 18 is also coupled to the $\overline{Q}$ output terminal 29 by N channel device 30, which is operated by $T_L'$ at terminal 31.

Node 17 is coupled to the Q output terminal 32 by N channel device 33, which is operated by $T_L'$ at terminal 34.

FIG. 2 is a graph showing the states of the various control signals as a function of time. At $t_0$, $T_B'$ and $T_C$ are high, while $T_L$ and $T_L'$ are low. For this state, nodes 17 and 18 are floating by virtue of toggles 14 and 15. Device 16 couples nodes 17 and 18 together and device 26 couples them to input terminal 25. Both nodes 17 and 18 will charge to whatever potential is present at terminal 25.

Then at time $t_2$, $T_B'$ goes low and device 16 opens. This allows node 17 to float, but its voltage will remain substantially where it was at time $t_0$ because there is very little current leakage associated with the node.

Then at time $t_4$, $T_C$ goes low and turns device 26 off. This now allows node 18 to float at whatever potential was present at $t_4$. It is this time interval $t_2$–$t_4$ in which the differential voltage is created and the sense operation occurs.

At time $t_5$, $T_L$ goes high and toggles 14 and 15 cause devices 10 through 13 to become active to create a latch. If node 18 moved slightly higher during the $t_2$–$t_4$ interval, the latch will quickly drive node 18 to $V_{CC}$. If node 18 moved slightly down during the $t_2$–$t_4$ interval, at time $t_5$, node 18 will quickly go low to ground.

This latching action will occur with only about a 0.05 volt shift in level during the $t_2$–$t_4$ interval. Thus, the circuit is quite sensitive. Then the time $t_6$, $T_L'$ goes high and, by way of devices 30 and 33, will couple nodes 17 and 18 to outputs Q and $\overline{Q}$ at terminals 32 and 29, respectively.

It can be seen that at $t_2$ both nodes 17 and 18 will have been charged to the input potential and the sensing operation occurred in the $t_2$ to $t_4$ interval. The difference of the charge injected into nodes 17 and 18 while switching in response to $T_B'$ to $T_C$ will be concelled out by making devices 16 and 26 the same size. The actual sense operation is very fast because of the high gain in the latching circuit, and the fact that node 18 needs to move only 0.05 volt to cause latching. Because both nodes 17 and 18 were charged to the input level prior to $t_2$, any input offset voltage is automatically canceled.

One useful application of the sense amplifier is in conjunction with a comparator of the type disclosed in U.S. Pat. No. 4,191,900. FIG. 3 is a schematic diagram of a dual input clocked comparator 40 driving the sense amplifier shown at 41. It is to be understood that sense amplifier 41 is the circuit of FIG. 1 and operates as heretofore described. FIG. 4 is a graph showing the waveforms used in the circuit of FIG. 3.

Sense amplifier 41 has its input node 25 coupled to inverting amplifier 45. Switch 46 periodically couples node 25 to node 49, thereby forcing amplifier 45 to its trip point. Dummy switch 48 is driven by a complementary switching signal so as to cancel switching transients at node 49. Capacitor 50 couples the input of amplifier 45 to node 51, which is alternately switched between inputs 56 and 57 by switches 52 and 53. This switching is operated by complementary switching signals $T_S$ and $\overline{T_S}$ at terminals 54 and 55, respectively.

In the interval $t_0$–$t_1$, waveform $T_B$ is high so that switch 46 is on. Amplifier 45 is at its trip point and capacitor 50 will charge to the difference in potential between nodes 25 and 51.

Then at $t_1$, $T_B$ goes low to turn switch 46 off. (At the same time dummy 47 will couple a transient canceling pulse to node 49.) The potential at node 25 will remain unchanged at the preset trip point. At $t_3$ the waveform $T_S$ goes low, thereby coupling node 51 to input terminal 56. If terminal 56 is at the same potential as terminal 57, there will be no change in potential at node 25. However, if terminal 56 is more negative than terminal 57, node 25 will rise and if terminal 56 is more positive than terminal 57, node 25 will fall just after $t_3$.

As pointed out above, sense amplifier 41 will be responsive in the interval $t_2$–$t_4$ so that at $t_3$ it will respond to the difference in potential between terminals 56 and 57. If node 51 rises at $t_3$, because terminal 56 is above terminal 57, node 18 will fall and then go to zero at $t_5$ while node 17 will go to $V_{CC}$ at $t_5$. Thus, input 56 is labeled (+) with respect to output terminal 32. Thus, the comparator will produce an output state that is related to the d-c input potentials at terminals 56 and 57. While the comparator is a-c coupled, the clocking signals of FIG. 4 make the circuit d-c responsive. Such a-c coupling permits the cascading of amplifier sections. If amplifier 45 has insufficient gain, one or more additional stages can be cascaded, each one with its own coupling capacitor, input-output switch and dummy input switch. This permits the attainment of almost any desired system sensitivity. As shown above, latch 41 will respond to a 0.05 volt difference. If amplifier 45 has a gain of 1000, the input sensitivity is 50 microvolts. A gain of 10,000 produces a 5 microvolt sensitivity.

One of the important advantages of the sense amplifier 41 of FIG. 3 is its ability to compensate bias level and offset errors. For example, at the end of the sense interval, at $t_4$ of FIG. 4, the output voltages are as follows:

$$V_{17} = V_{BIAS} + [-G(\pm V_{OFFSET})]$$

where:

$V_{17}$ is the voltage of node 17 at $t_4$
$V_{BIAS}$ is the operating point voltage of comparator 40
G is the gain of amplifier 45
$V_{OFFSET}$ is the offset error voltage of node 25 which is due mainly to imperfect balance between devices 46 and 47.

$$V_{18} = V_{BIAS} + [-G(V_{56} - V_{57} \pm V_{OFFSET})]$$

where:

$V_{18}$ is the voltage at node 18 at $t_4$
$V_{56} - V_{57}$ is the differential input voltage
The voltage difference seen by the sense amplifier is:

$$V_{17} - V_{18} = V_{BIAS} + [-G(\pm V_{OFFSET})] - V_{BIAS} - [-G(V_{56} - V_{57} \pm V_{OFFSET})]$$

This reduces to:

$$V_{17} - V_{18} = G(V_{56} - V_{57})$$

Note that the terms $V_{BIAS}$ and $V_{OFFSET}$ drop out.

EXAMPLE

The circuit of FIG. 1 was constructed using conventional CMOS technology. The following chart indicates device sizes. The waveforms of FIG. 2 were applied as described above.

| DEVICE | SIZE W/L Microns |
|--------|------------------|
| 10 | 9/5 |
| 11 | 20/5 |

-continued

| DEVICE | SIZE W/L Microns |
| --- | --- |
| 12 | 9/5 |
| 13 | 20/5 |
| Toggle 14 P channel | 20/5 |
| Toggle 14 N channel | 5/5 |
| Toggle 15 P channel | 5/5 |
| Toggle 15 N ohannel | 20/5 |
| 16 | 14/5 |
| 26 | 14/5 |
| 30 | 14/5 |
| 33 | 14/5 |

The circuit required only 0.05 volt to trip. The sensing speed was improved by a factor of better than 10 relative to the conventional prior art circuits.

The invention has been disclosed and a working example described. An example of a useful application has further been detailed. When a person skilled in the art reads the foregoing, alternatives and equivalents, within the spirit and intent of heinvention, will occur to him. Accordingly, it is intended that the scope of theinvention be limitd only by the claims that follow.

I claim:

1. A CMOS sense amplifier comparator combination, said sense amplifier having an input terminal and first and second output terminals, comprising:
   first and second supply terminals connectable to a source of operating voltage;
   a pair of inverter gates cross coupled together in latching configuration so as to create a latch having first and second output nodes and a pair of supply terminals;
   a pair of polarity switches coupled between said first and second supply terminals and said pair of latch supply terminals and operated in complementary fashion, with each one of said pair being coupled to one of said inverter gates supply terminals wherein two states of latch operations are available, with the first state producing normal latching operation and the second state rendering said inverter gates inoperative;
   first switching device means coupled between said input terminal and one of said first and second output nodes;
   second switching device means coupled between said first and second output nodes whereby, when said second switching device is turned on, said nodes are at the same potential and when said second switching device is turned off, said nodes can be at different potentials;
   third switching device means coupled between said first output node and said first output terminal;
   fourth switching device means coupled between said second output node and said second output terminal;
   an inverting amplifier having an input and an output coupled to said sense amplifier input;
   a coupling capacitor having one terminal coupled to the input of said amplifier; and
   fifth and sixth switching means coupled to the other terminal of said capacitor and coupled separately to provide said comparator input terminals which are connectable to potential sources to be compared.

2. The CMOS sense amplifier of claim 1 further comprising means for operating said pair of polarity switches and said first and second switching means in accordance with the sequence comprising:
   first, setting said polarity switches so as to render said inverter gates inoperative and turning said first and second switching means on, thereby to allow said first and second output nodes to charge to the potential at said input terminal;
   second, opening said second switching means, thereby allowing one of said output nodes to float while maintaining the other of said output nodes at the potential of said input terminal;
   third, opening said first switching means, thereby allowing both of said output nodes to float;
   fourth, reversing the states of said pair of polarity switches, thereby rendering said latch operative.

3. The CMOS sense amplifier of claim 2 wherein said fifth and sixth switching means are operated in complementary fashion after said second switching means is opened and before said first switching means is opened.

4. A CMOS sense amplifier, having an input terminal and first and second output terminals, comprising:
   first and second supply terminals connectable to a source of operating voltage;
   a pair of inverter gates cross coupled together in latching configuration so as to create a latch having first and second output nodes and a pair of supply terminals;
   a pair of polarity switches coupled between said first and second supply terminals and operated in complementary fashion, with each one of said pair being coupled to one of said inverter gates supply terminals wherein two states of latch operations are available, with the first state producing normal latching operation and the second state rendering said inverter gates inoperative;
   first switching device means coupled between said input terminal and one of said first and second output nodes;
   second switching device means coupled between said first and second output nodes whereby, when said second switching device is turned on, said nodes are at the same potential and when said second switching device is turned off, said nodes can be at different potentials and
   means for operating said pair of polarity switches and said first and second switching means in accordance with the sequence comprising:
      first, setting said polarity switches so as to render said inverter gates inoperative and turning said said first and second switching means on, thereby to allow said first and second output nodes to charge to the potential at said input terminal;
      second, opening said second switching means, thereby allowing one of said output nodes to float while maintaining the other of said output nodes at the potential of said input terminal;
      third, opening said first switching means, thereby allowing both of said output nodes to float;
      fourth, reversing the states of said pair of polarity switches, thereby rendering said latch operative.

5. The CMOS sense amplifier of claim 4 further comprising third switching means coupled between said first output node and said first output terminal and fourth switching means coupled between said second output node and said second output terminal.

6. The CMOS sense amplifier of claim 5 further comprising means for operating said third and fourth switching means so as to be initially off and then turned on after said latch is rendered operative.

* * * * *